(12) United States Patent
Hoenig et al.

(10) Patent No.: US 6,215,312 B1
(45) Date of Patent: Apr. 10, 2001

(54) METHOD AND APPARATUS FOR ANALYZING AN AGZN BATTERY

(76) Inventors: Steven Hoenig, 67 Dawson St., Staten Island, NY (US) 10314; Patrick M. Rudai, 602 Paulison Ave., Clifton, NJ (US) 07011; Thirumalai G. Palanisamy, 14 Canterbury Way, Morristown, NJ (US) 07960; Harmohan Singh, 35 Sherbrook Dr., Rockaway, NJ (US) 07866

( * ) Notice: Subject to any disclaimer, the term of this patent is extended or adjusted under 35 U.S.C. 154(b) by 0 days.

(21) Appl. No.: 09/437,886

(22) Filed: Nov. 9, 1999

(51) Int. Cl.[7] .................................................. G01N 27/416
(52) U.S. Cl. ............................................. 324/427; 324/432
(58) Field of Search .................................. 324/427, 430, 324/432, 433

(56) References Cited

U.S. PATENT DOCUMENTS

| | | | |
|---|---|---|---|
| 5,281,919 | * 1/1994 | Palanisamy | 324/427 |
| 5,672,951 | 9/1997 | Shiota | 320/5 |
| 5,680,050 | 10/1997 | Kawai et al. | 324/427 |
| 5,705,929 | 1/1998 | Caravello et al. | 324/430 |
| 5,721,688 | 2/1998 | Bramwell | 364/483 |

* cited by examiner

*Primary Examiner*—Peter S. Wong
*Assistant Examiner*—Gregory J. Toatley, Jr.

(57) ABSTRACT

A method and apparatus for diagnosing the status of a battery having high and low voltage plateau states corresponding to its state of charge in which the battery open circuit voltage is measured (S106) to determine its voltage state and its internal resistance also is measured (S114). A battery having a low voltage state (S116) is tested to determine if its internal resistance is greater than a predetermined maximum resistance (S118) and if it does the battery is considered as possibly having a low electrolyte level, and if it does not the battery is subjected to a current ramp test to determine from the voltage response a point of current transition (S130) due to a battery chemical gassing reaction. The battery state of charge (S132) is determined from curves or algorithms of state of charge versus current transition. Each of a battery of high voltage state (S116) whose internal resistance is less than the maximum internal resistance and one whose internal resistance is greater than the maximum internal resistance and has been subjected to reconditioning by applying successive current pulses (S124, S126) to reduce its internal resistance is subjected to a current ramp test (S134) to determine the point of current transition and the state of charge of such battery is determined (S136) from a different set of curves or algorithms of state of charge versus current transition. Capacity of a battery of the two voltage state types is determined by charging it to its capacity (S144), applying a current ramp (S144) to determine the point of current transition and determining capacity from curves or algorithms of battery capacity versus current transition (S150).

20 Claims, 10 Drawing Sheets

ANALYSIS STEPS TO DETERMINE DEFECTS, SOC & CAPACITY - AgZn

FIG. 2 ANALYSIS STEPS TO DETERMINE DEFECTS, SOC & CAPACITY - AgZn

LEVEL I - SAMPLE CALIBRATION CURVE - 40Ah CELL

METHOD AND APPARATUS FOR ANALYZING AN AGZN BATTERY

GOVERNMENT STATEMENT

All or part of this invention was developed for the United States Navy under Government Contract No. N00164-96-C-0045. The U.S. Government may have certain rights to this invention under terms of the contract.

BACKGROUND OF THE INVENTION

Presently, the methods and systems available to determine the health and status of certain batteries, such as of the silver-zinc type, are limited. Two parameters to be determined are the battery state of charge (SOC) and its capacity (CAP), usually rated in Amp hours. The current method used to determine the capacity of a silver-zinc battery is to charge it to 100% state of charge, and then fully discharge the battery at constant current. The capacity in Amp hours is determined by multiplying the discharge current (Amperes) by the discharge time (hours). Following this, the battery must be fully charged once again to be ready for use. This method involves a significant amount of charging and discharging. This is extremely time consuming and destructive of the battery health. The latter factor is directly related to the limited cycle life of silver-zinc batteries. Also, no means is currently known to instantaneously measure battery SOC.

Batteries, such as silver-zinc batteries have especially limited cycle lives, and any unnecessary cycling should be avoided. Therefore, a need exists for a method to perform a comprehensive diagnostic on a battery, including determination of SOC and capacity, without performing unnecessary discharge cycling on the battery. Also, a method and apparatus is needed to determine defects in a battery, such as a low electrolyte condition.

BRIEF DESCRIPTION OF THE INVENTION

The subject invention is directed to a method and apparatus that performs a step-by-step diagnostic procedure to evaluate the health and status of a battery, such as of the silver-zinc type. Such batteries have the characteristic of first and second voltage plateaus, or states, corresponding the battery charge condition, with the first state being of a lower value than the second. The method and apparatus operates to identify a given battery, and then perform a thorough diagnostic in a rapid and efficient manner. This includes examining the battery for internal defects such as low electrolyte, and diagnosing overall status and health of the battery with tests using the battery voltage state. The user is automatically informed of battery condition, and of any actions that should be taken to preserve or repair the battery.

This invention also accomplishes determination of the state of charge of a battery such as of the silver-zinc type at any charge state of the battery on a substantially instantaneous basis using algorithms based on cell size. Further, battery capacity is determined based on a novel algorithm. The aspect of invention used to measure battery capacity can be extended to include various cell sizes, or normalized to cells across a range of capacities. The system and method described herein can determine battery capacity without requiring that the battery be discharged. It is significantly faster, and will not have any harmful effect on the battery and its performance.

OBJECTS OF THE INVENTION

It is therefore an object of the invention to provide a method and apparatus to perform a comprehensive diagnostic of a battery.

Another object is a method and apparatus for the automatic evaluation of the health and status of a battery through the use of a computer controlled charging and test system.

A further object is to provide a method and apparatus for determining the capacity of a battery without subjecting it to charge and discharge.

An additional object is to provide a method and apparatus to determine the state of charge of a battery on a substantially instantaneous basis.

Still a further object is to provide a diagnostic method and system to determine internal defects of a battery and to recondition a battery.

BRIEF DESCRIPTION OF THE DRAWINGS

Other objects and advantages of the present invention will become more apparent upon reference to the following specification and annexed drawings in which.

DETAILED DESCRIPTION OF THE INVENTION

1. Diagnostic Method and System

Figure 1:
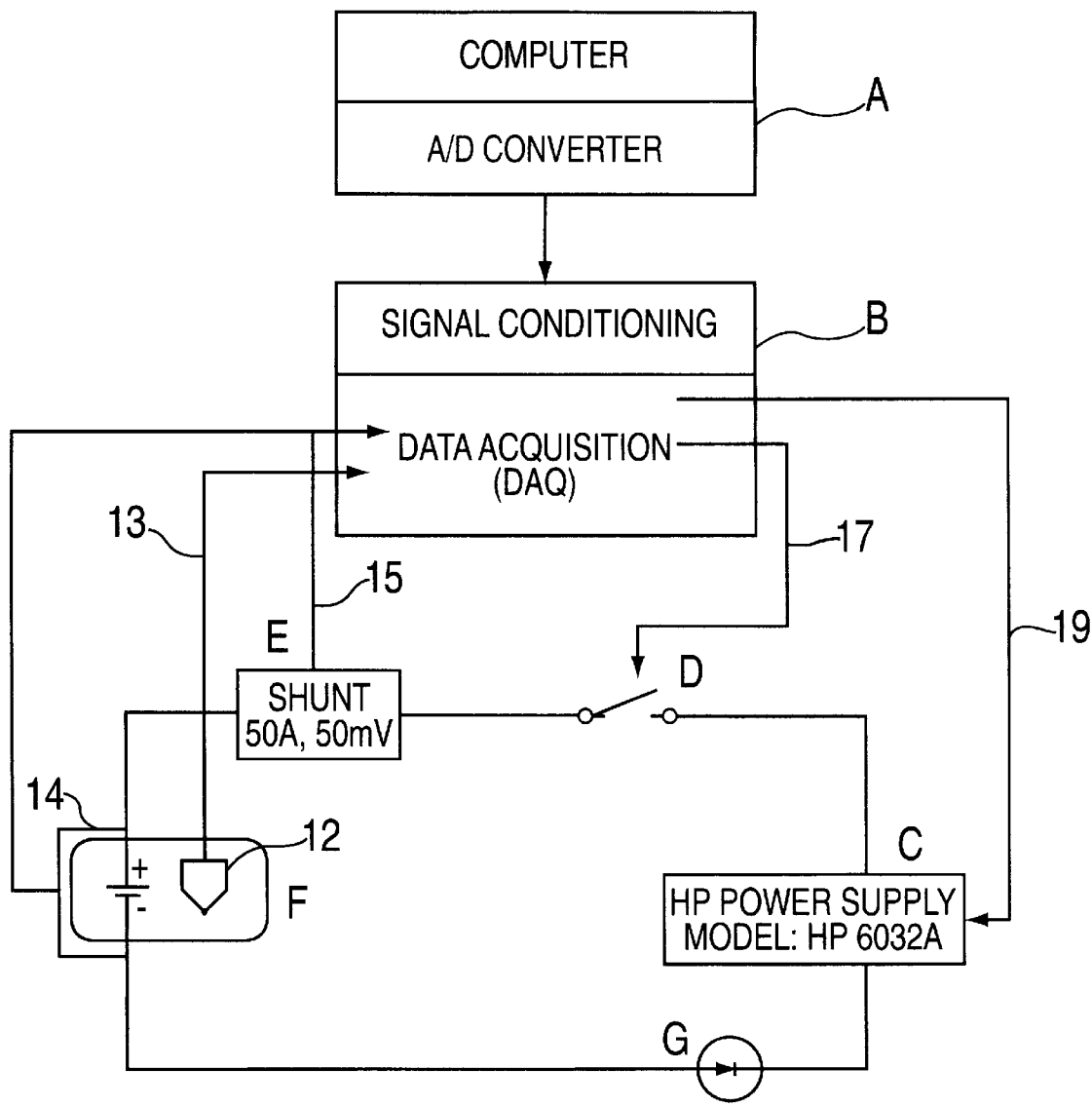
FIG. 1 is a schematic diagram of the charging and diagnostic test system.

FIG. 1 is a diagram of a battery test setup in accordance with the invention. A battery typically can have one or more cells, with a battery of a number of cells having these connected in series or parallel. Here, the term "battery" is used generally to indicate both those of the types having one cell or more than one cell connected in series or in parallel. Also, it is possible to use the system and method of the invention to test a selected one cell of a multi-cell battery by appropriate connection of the system to the one cell of the battery being tested.

Also, the present invention is illustratively described with respect to the testing of silver-zinc batteries, that is, batteries whose positive and negative plates are of silver and zinc, with the plates being immersed in an electrolyte. The principles of the invention can be extended to other types of batteries, particularly those having two plateaus, or states, of the voltage in its charge/discharge curve, the states respectively corresponding to the degree of charging (state of charge) of the battery.

Referring to FIG. 1, the battery is designated F, with the positive and negative terminals shown by the usual + and − symbols. A thermocouple 12 is mounted on the battery outer casing or immersed in the battery electrolyte to measure the battery temperature. This data is used, as described below.

The diagnostic system of the invention includes a computer A of any suitable conventional microprocessor type that includes data input, e.g., a keyboard, and output, e.g., a printer and/or display, resources. The computer A includes an application program having the necessary instructions to control the charging of the battery and to perform various measurement functions. The program can be embedded in read only memory (ROM). The computer also includes the usual RAM type memory, data processing unit and computational facilities. The computer is also shown as having a date acquisition module (DAQ) which inputs the data from various sources.

Charging current is supplied to the battery F from a controllable variable current source C. This can be any conventional current supply that has a controllable variable output. The current path to one of the battery terminals is through a relay D, under control of the computer A. The current supply circuit also includes a protective diode G in series between the current supply and the other battery terminal.

Reference character B indicates a unit having a data acquisition portion (DAQ) and a control portion that is connected to the computer A for bi-directional communication. A signal conditioning module can be used in unit B to interface the computer to the battery F to minimize noise and transients. The DAQ portion of unit B includes a voltmeter whose input leads 14 are connected across the battery terminals to measure its voltage during charging, discharging and open circuit (no charge or discharge) conditions. During charging of the battery relay D is closed, and in the battery open circuit condition relay D is open, that is, no charge is being applied.

The unit B receives temperature data over line 13 from the battery thermocouple 12, which is converted to digital form for use by the computer A. Voltage across shunt E, of known resistance value, is measured on an averaging basis. The voltage, current and temperature data acquired by the DAQ portion of unit B is analog in form. It is applied to the computer A which includes an analog to digital converter (A/D) to convert the analog signals to digital data for use by the computer. All of this is conventional.

The unit B has two output control functions. The first is control of the relay D in the battery charging circuit. That is, at appropriate times as instructed by computer A, the relay D is opened and closed by a signal over line 17 to stop and to carry out charging of the battery by current supply C. The second control function is to control the output current value of supply C. For example, this can be done by the digital to analog converter in the control portion of unit B responding to a digital output signal from computer A to produce a signal to control the current source C. As described below, the source C is operated to produce steady current flow, pulse flow and a ramp type flow that monotonously increases and decreases between two values.

The method and apparatus for performing the diagnostic of the battery are under control of the application (software) program of computer A to automatically perform the entire diagnostic testing of a battery F through the use of the computer A and data acquisition input and output control portions of unit B. The computer software controls the entire charge/discharge of the battery.

The operation of the system and method of analysis is described with reference to the flow chart diagram of FIG. 2. In steps 102, the diagnostic system first identifies the battery to be analyzed, either by a bar code reader technique to acquire data imprinted on the battery case or through direct user input. That is, the identity and corresponding characteristics of the battery being diagnosed are stored in computer memory for use during the diagnosis. These characteristics include such factors as the battery type, rated voltage, and rated capacity.

In S104, the user is instructed, such as by an indication on a computer display or operated by the computer by voice message, to attach the battery to the system. The system then confirms proper connection by measuring the battery open circuit (no load) voltage (OCV) by the voltmeter of unit B. That is, the voltage is measured with relay D open and no current is being applied. The measured OCV should be above 0 V. If a negative voltage (V<0) is measured, the user is instructed by the visual display or an audible sound to reverse the battery leads. The voltmeter output for this step is analyzed by a suitable logic circuit that determines if the measured voltage is above or below zero volts. Only after correct battery connection is ensured will further battery analysis continue.

Assuming that the battery leads and voltmeter are properly connected, the system next analyzes the battery in S106 for a shorted cell defect. Here, the battery open circuit voltage (OCV) is measured. Unless the battery is completely discharged, i.e., the cells are shorted thereby giving a 0V response, the open circuit voltage should be above a certain value. This value is programmed in the computer in S102 corresponding to the identity of the battery under test. In the case of a silver-zinc battery, the voltage of a cell should be no less than 1.60±0.05 V.

If the voltage measured in S106 is below this value, the battery is considered as one whose cell, or cells, may be shorted. To determine this, the system supplies a slow charge current of C/X Amps, where C is the battery rated capacity in Amp hours (Ah). In the example of the silver-zinc battery, typically X=40 so that, for example, a 40 Ah rated battery would be charged at 1 A. This charge is continued for a predetermined time, such as 10 minutes, after which the battery is allowed to rest for 10 minutes. Following this, the battery voltage is measured once again. If the voltage still remains below the limit, 1.6 V±0.05 V in the example here being considered, the cell is considered to be shorted and must be discarded, indicated in S110. This defect condition can be indicated by a visual or audible signal. If the battery maintains an open circuit voltage above the limit, the diagnostic analysis proceeds.

The next several steps performed involve the determination of the battery state of charge (SOC), as well as the analysis for a low electrolyte condition. With the loss of electrolyte, the effective active area of the battery's plates (here, silver and zinc) that supports the electrochemical reaction to deliver current is reduced, thereby reducing the effectiveness and operability of the battery. The internal resistance (IR) of the battery is generally considered to be a good indicator of the condition of electrolyte level, and is used here for analyzing the electrolyte condition. A high IR measurement will typically be indicative of a low electrolyte condition. However, in addition to the low electrolyte condition, a battery having an SOC within certain limits corresponding to that of a "good" battery may also have a high internal resistance (IR) value, thereby falsely indicating a low electrolyte defect. For that reason, the testing for low electrolyte is incorporated somewhat into the SOC measurement technique, as described below.

Internal resistance (IR) is measured in S114 by the computer A controlling the current source to apply a C/Y Amp current charge pulse, where C is the battery rated capacity in Amp hours, to the battery. As an example, Y=5 and the pulse duration is 10 seconds. The response voltage of the battery to the current charge pulse is monitored and the IR value is calculated in S114 as the dV/dI value on the falling (trailing) edge of the current pulse. That is, the pulse of charging current (I in amps) is applied and a measurement of the instantaneous voltage change (dV) produced is made on the trailing edge of the applied current pulse, corresponding to the instantaneous current change (dI) along that edge, to determine dV/dI.

This is accomplished in a practical manner, although not truly instantaneous using the following:

$$IR = (V_{FALL} - OVC_{AFT})/I$$

where
$OCV_{AFT}$=open circuit voltage immediately after current pulse
$V_{FALL}$=battery voltage immediately before current fall, and
I=applied current This equation can be calculated by the computer.

The charge and discharge voltage curves of batteries often have different voltage plateaus. For example, in silver-zinc cells there are two voltage plateaus or states, hereafter called "high" and "low". These are 1.60±0.05 V for the discharged, or low, state of the battery and 1.86±0.05 V for the charged, or high, state measured as open circuit voltages. A low state (1.60 V) open circuit voltage usually is found in lower conditions of battery state of charge (0%–70% SOC), while a high voltage state (1.86 V) open circuit voltage is found in the higher states of battery charge (30%–100% SOC). As seen, some overlap exists between the above SOC ranges for batteries of high and low voltage states.

The battery is to be further analyzed relative to its IR on the basis of whether the OCV resides in the low open circuit voltage state in S118, or in the high open circuit voltage state in S122. Here, the selection for test by either S118 or S122 is made on the basis of an intermediate voltage value of 1.7 V, which is between the two plateaus. This is measured in S116. The 1.7 V intermediate voltage distinguishes as to which of the two voltage levels the battery is residing at.

A standard set of $IR_{MAX}$ limits have been determined for different size (capacity) batteries. These are stored in the computer A memory and the identity of the battery being analyzed calls up its corresponding set of $IR_{MAX}$ limits. The IR measured in S114 is compared with these maximum limits in S118 and S122. If the IR is within the assigned limits, the battery is considered to have sufficient electrolyte and proceeds with further testing (state of charge, SOC). If the measured IR exceeds the $IR_{MAX}$ limit, the possibility exists of a low electrolyte condition.

For a battery in which the open circuit voltage is in the low state 1.60 V (below 1.7 V of S116), the IR is compared in S118 against its $IR_{MAX}$ value. For such a battery having its IR>$IR_{MAX}$, this gives a clear indicator of low electrolyte for that battery. This is displayed in S120. Thus, if the open circuit voltage is measured to be of the low state voltage and there is a high IR measurement, IR>$IR_{MAX}$, that cell is considered to be defective, and must be removed from service until repaired.

For a battery in which the OCV resides at the high voltage state 1.86 V (above 1.7 V) at S116) if there is a high IR, that is, IR>$IR_{MAX}$ in S122, the battery probably has sufficient electrolyte, but suffers from a different, but possibly correctable, problem. This problem in silver-zinc batteries develops from the cycling activity of its cells. Such a battery may be recoverable.

When a silver-zinc battery whose state of charge is in the range of 70% to 100% SOC is released from a discharge current, its open circuit voltage will initially rest at the low state (1.6 V). Though the voltage will remain there for some time, it will eventually migrate upwardly to the high state (1.86 V). With this voltage change comes a sharp increase in the battery internal resistance. This specific high IR state is a natural part of the silver-zinc electrochemical process cycle, but could be confused with the indication of a defect, resulting in possibly discarding a good battery.

In an attempt to correct for the above condition, a battery whose voltage resides in the higher open circuit voltage region (e.g., >1.70 V) and found to have an IR>$IR_{MAX}$ as measured in S122 is subjected to a reconditioning process in S124, which is described below. By using such process, the battery is effectively reconditioned, resulting in the measured IR dropping to within acceptable limits, and the diagnosis of the reconditioned battery will be continued with state of charge testing. Accurate state of charge testing cannot be performed if the high IR condition exists in a battery. The use of the reconditioning procedure therefore extends beyond its initially described purpose. If, however, the battery cannot be reconditioned, indicated in S126, it is defective (low electrolyte) and must be removed from service, indicated in S128, until repaired.

A battery that has been found in S122 to have an acceptable IR (IR<$IR_{MAX}$), or that has been reconditioned in S124, is next subjected to state of charge (SOC) testing. As previously explained, the voltage charge and discharge curves of the battery have the two plateaus, designated as high and low states, and here corresponding to open circuit voltages of 1.6 V and 1.86 V for a silver-zinc battery. In a rested state, the open circuit voltage of a good battery will be at either of these two voltage plateau states, determined on the basis of the 1.7 V point in overlap region as discussed above, depending on the battery state of charge. The condition of the battery at each of these voltage states is completely different, and hence the response to testing also is different. Therefore, in order to measure state of charge, the system first determines the battery's open circuit voltage. If the open circuit voltage is of the low state, here about 1.6 V (<1.7 V in S116), the diagnostic proceeds with a Level I state of charge analysis. If the open circuit voltage is of the high state, here about 1.86 V (>1.7 V in S116), the system will proceed with a Level II state of charge analysis. The exact details for the determination of state of charge are described below with reference to FIGS. 3–7.

Level I testing determines the state of charge for batteries having a low state (less than 1.7 V and typically about 1.6±0.05 V) open circuit voltage and IR<$IR_{MAX}$. During testing, in S130, the current supply C is operated by the computer A to produce a current charge ramp beginning at 0 A that is applied to the battery at a designated slope, here 0.6 A/sec, with a specific preset voltage, here 2.05 V. The limits, which can include a current limit, are preprogrammed corresponding to the battery type. When either of these limits is reached, the current is ramped back down to 0 A at an equal but negative slope. That is, the current ramp for the SOC determination in S130 has both a rising and a falling portion. The data input module DAQ of unit B monitors and records the battery voltage response and the applied current ramp.

A transition current ($I_{TRAN}$) is measured based on the point of maximum positive rate of change of the slope of the voltage response. The battery state of charge (SOC) is then determined in S132 as a function of $I_{TRAN}$. The precise function used for the calculation is dependent on the battery size (capacity). This is described in greater detail with respect to FIGS. 3–7.

Level II testing determines the state of charge for a battery having a high state (>1.7 V and typically 1.86±0.05 V) open circuit voltage and IR<$IR_{MAX}$. During this testing in S134, a current charge ramp beginning at 0 A is applied to the battery at a given rate, here illustratively shown as a 0.1 A/sec. The current continues rising until it meets a preset voltage limit, here 2.05 or 2.1 V, after which the current is ramped down at an equal but negative slope until it reaches 0 A. The data analysis DAQ module of unit B monitors and records the data of the applied current and the voltage response thereto. A transition current ($I_{TRAN}$) is also measured, but is based on the point where the voltage response curve has its maximum negative slope. Battery state of charge is then determined in S136 as a function of $I_{TRAN}$, with the specific function dependent on the battery size (capacity). This is described below with respect to FIGS. 3–7.

After making the SOC determination in either S132 or S136, for a battery that is found to have an acceptable level charge, the diagnostic allows the user in S140 to decide if a full charge and capacity testing are desired. The user can be advised of this by a voice or display message. If not, the diagnostic is ended in S142.

If the answer in S140 to further testing is yes, the battery is charged in S144 at constant current to a 100% state of charge, after which it is allowed to rest for 10 minutes. Further analysis and testing is then applied. The charge rates used in this invention are preferably those recommended by the battery manufacturer although other methods may be used to reach the 100% SOC battery charge state.

The battery is then tested in S146 for battery capacity, which involves a two step process. A C/Y Amp C is the battery capacity) current charge pulse, is first applied in S146 to the battery for a predetermined time, here 10 seconds, after which the current returns instantaneously to 0 Amps. In the present example, Y=5. Battery voltage is measured and recorded throughout the test. The battery voltage measured immediately before the current charge pulse drops to 0 Amps is designated as the voltage limit ($V_{FALL}$) and is used for the subsequent test.

A current ramp, starting at 0 A, is then applied in S148 to the battery. The current is increased at a constant rate, such as a 0.1 A/sec rate, until either the current amplitude reaches a maximum, here 15 A, or the battery voltage reaches the voltage limit ($V_{FALL}$) determined in the step S146. The current is then ramped back down to 0 A at the same, but negative, slope. The data analysis DAQunit B of FIG. 1 continually monitors applied current and response voltage and the computed SOC.

Using the data from the ramp test in S148, the diagnostic calculates the battery capacity. The basic methodology for this involves monitoring the response voltage for the point at which the slope of the voltage response stops decreasing, and begins to either increase or remain constant. This point reflects the transition from a charge reaction to a gassing reaction, referred to as the gas point. The cell capacity is then determined in S150 as a function of that current value at the transition point ($I_{TRAN}$) The details of the battery capacity test are described below with respect to FIGS. 8–10.

The diagnostic in S152 then compares the capacity calculated in S150 with the rated capacity of the battery. The latter is determined from the battery identity information of S102. If the calculated capacity is less than the rated or acceptable capacity, the user is informed in S154 that the battery has suffered a loss of capacity. Otherwise, the user is informed in S156 of the battery capacity and battery health. The diagnostic is then completed, and the battery is ready to be returned to service.

The diagnostic described above uses several different steps to diagnose the health of a battery, where each step involves testing for a different battery condition. In addition to the steps themselves, the sequence through which they are taken, as shown in FIG. 2, is also important for properly determining the health of a battery, such as of the silver-zinc type.

2. State of Charge (SOC) Measurement

Figure 2:
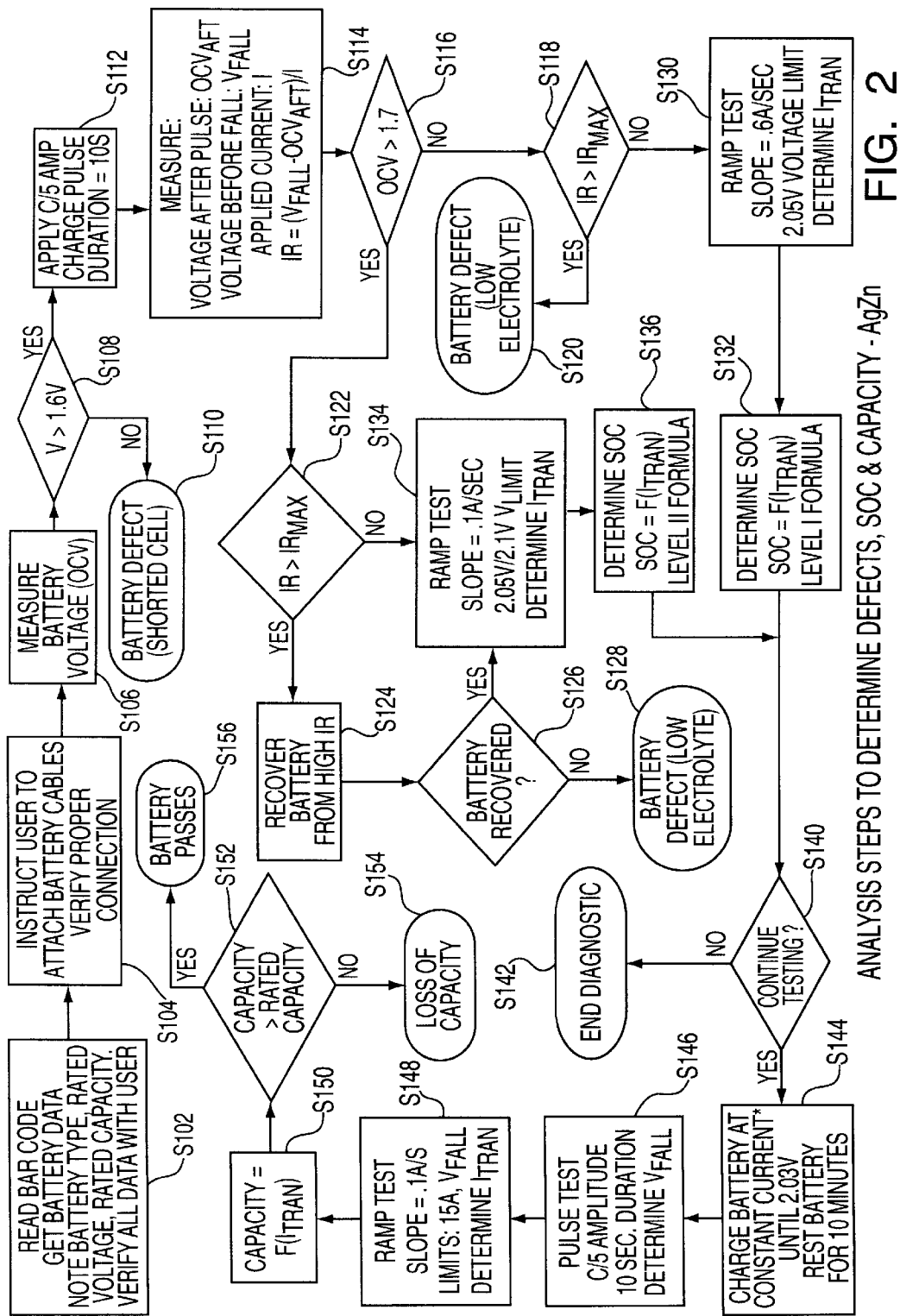
FIG. 2 is a flow chart of the battery diagnostic test.
Figure 3:
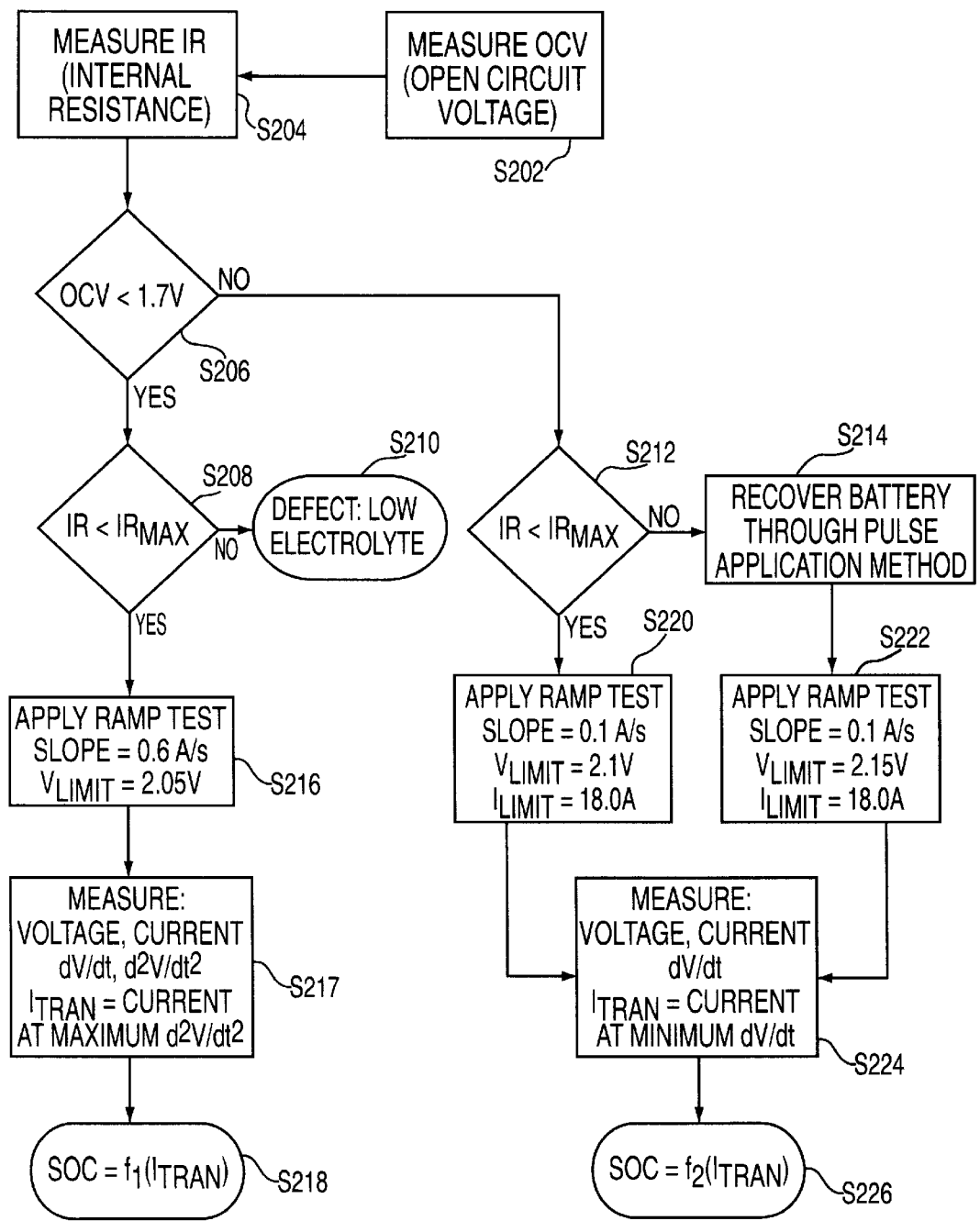
FIG. 3 is a flow chart showing the steps used in measuring the state of charge of a battery.

The determination of SOC, referred to in steps S116–S136 of FIG. 2, is described in greater detail referring to FIGS. 3–7. It should be noted that the SOC determination of a battery can be made independently of the other tests of FIG. 2. In accordance with the preferred embodiment of the invention, the SOC determination can be made at any charge state of the battery, although there will be greater accuracy at higher battery charge states. The steps involved in this SOC measurement portion of the diagnostic are shown in FIG. 3 in a flowchart format, and are referred to in the following description.

Before starting the test cycle to measure battery SOC, safe voltage and current limits are established as part of the computer program by knowing the battery characteristics.

As previously explained, the charge and discharge curves of silver-zinc batteries exhibit the two voltage plateaus, or states, of 1.60 V and 1.86 V, referred to as the "low" or "high" status. In a rested state, the open circuit voltage of a healthy battery will reside at either of those two states, depending on its state of charge. Each of the open circuit voltage states are related to a specific state of charge (SOC) ranges for the battery. In the direction of the battery being charged, there are two specific areas of different voltage activity. For a battery having an SOC of from 0% to –30% (i.e., the battery whose SOC is between 0%–30% of its rated capacity) when released from a charge stimulus, i.e., charging is stopped, the battery voltage will rest at the low state, here, 1.6 V. For a battery having an SOC of from 30% to 100%, when released from a charge stimulus, the battery open circuit voltage will rest at its high state, here 1.86 V. The indicated open circuit voltages are all reached within minutes of release from charge.

In the direction of battery discharge there also are two different areas of voltage activity. For a battery in the 0% to 70% SOC range, when released from a discharge stimulus the battery open circuit voltage will rest at the low state, here 1.60 V, and will do so within minutes. For a battery in the range of 70% to 100% SOC, upon release from discharge stimulus the battery will initially rest at the low state open circuit voltage, here 1.60 V. However, some time after being released from the discharge stimulus, the voltage of the battery in the high range SOC will migrate to the high OCV state, here 1.86 V. The time taken to do this is dependent on how close the battery is to 70% SOC transition point. The closer the battery is to 70% SOC, the longer it will take the battery to switch voltages from the low to high state. Only a small amount of that time is actually spent in transition. Specific to this condition is that once the battery reaches the high open circuit voltage state, here 1.86 V, it develops a very high internal resistance IR (typically exceeding the $IR_{MAX}$ noted in Section 1). The closer the battery is to the 70% SOC, the higher will be the IR induced into the battery upon voltage transition.

In all cases though, the open circuit voltage will be one of the low or high states, 1.60 V or 1.86 V, for a non-shorted cell. These two specific voltage levels are achieved almost instantaneously, after an external charge or discharge stimulus current is removed. Two distinct algorithms have been developed to determine SOC, which are specific to the measured high or low state open circuit voltage of the battery being diagnosed. This can be done with silver-zinc batteries specifically because their behavior is so precisely binary, i.e., a (healthy) good battery has only one or the other of the low or high open circuit voltage state values.

The SOC test proceeds in three stages.

Stage I

Referring to FIG. 3, the first stage of analysis is to measure in S202 the battery open circuit voltage. Next, regardless of the value of the open circuit voltage, in S204 the internal resistance of the battery is determined. This corresponds to S114 of FIG. 2. During the test of S204, a step charge current is applied to the battery, and the battery response voltage is measured. As explained relative to S114, the current is started from 0 Amps and increases instantaneously (as fast as the power supply is capable) to a predetermined proportion of the battery capacity C, here illustratively C/5 Amps. The current is maintained at that amplitude for a predetermined time, such as 10 seconds, after which it is returned instantaneously to 0 Amps. The voltage and current are continuously measured and recorded during this test cycle. The battery IR is calculated as the dV/dI measured on the falling edge of the charge current pulse. This is the instantaneous rate of change of voltage relative to that of the current. The battery IR also can be computed by the formula shown in S114.

Stage II

In S206 it is determined if the battery has a high or low voltage state. As in S116, a voltage of 1.7 V is selected as the dividing point. The measured battery internal resistance (IR) value determined in S204 is compared in S208 and S212 with predetermined IR maximum values for batteries having each of the low state or high state open circuit voltage. For a battery with a low state OCV, the diagnostic proceeds in S208 and subsequent steps with a Level I analysis. If the battery OCV measurement is the high state, the diagnostic proceeds to a Level II analysis in S212 and subsequent steps. At this point, the assumption is that the battery is not shorted, and therefore the open circuit voltage measures one or the other of the low or high voltage states. (1.60±0.05 V or 1.86±0.05 V)

At this point, the measure IR value is compared with predetermined maximum values ($IR_{MAX}$) for each of the batteries having the low state or high state open circuit voltage. This corresponds to S208 and S212 (S18 or S122 in FIG. 2). These limits of IR are in place to detect the presence of any defects (electrical related) which would need to be rectified before SOC measurements could be made.

The IR values used in S208 and S212 as $IR_{MAX}$ are listed in Table 1.

TABLE 1

Maximum Internal Resistance (IR) Constants

| Cell Size (Capacity) | $IR_{MAX}$ |
|---|---|
| 8 Ah | 120 mΩ |
| 12 Ah | 80 mΩ |
| 30 Ah | 30 mΩ |
| 40 Ah | 20 mΩ |

These values were known and programmed into the computer and are called up corresponding to the identity if the battery under test.

If a battery is at the low state open circuit voltage (S208), here 1.6 V, and the IR in S208 is of IR>$IR_{MAX}$, this indicates a possible defect, most likely due to low electrolyte. The battery is thus determined to be defective, as indicated in S210 and must be removed from service.

For a battery in which the open circuit voltage is at the high state, an indication of IR>$IR_{MAX}$ in S212 means that there is a good chance that the battery is still good, and can be reconditioned for use and proper SOC measurement.

Reconditioning is carried out as part of the state of charge measurement and as needed in response to the following condition. As explained earlier, if a battery resides in the 70% to 100% SOC range and is released from a discharge, the battery voltage will rest temporarily at the low voltage state, 1.6 V, but will eventually migrate to the high voltage state, 1.86 V. When it does go to the high voltage state, 1.86 V, the internal resistance (IR) of the battery will rise beyond set limits ($IR_{MAX}$) as determined per battery size. With a high IR, a Level II type SOC determination procedure will not work because the test response voltage is dominated by the high IR, rather than by specific SOC battery conditions. This will result in erroneous test data. The closer the battery SOC state gets to 70%, the higher the resulting IR will become. High IR measurements could typically be unnecessarily misdiagnosed as a defective cell, resulting in a large loss of inventory. However, the high IR condition is only a temporary and correctable one. The following procedure corrects this condition by reconditioning the battery and thereby allows an accurate state of charge measurement to be subsequently made.

Reconditioning is accomplished in S214 by continually applying current "bursts" until the battery IR settles back to its normal value. Each burst consists of a step charge current applied to the battery. The current is started from 0 Amps and increased instantaneously (as fast as the power supply is capable) to a fractional part of the battery capacity C, here illustratively C/5 Amps. The current is maintained at that amplitude for a predetermined time, here 40 seconds. The current then instantaneously is dropped to 0 Amps, and remains there for 10 seconds, after which another burst is applied. The process is continued for a maximum of 4 bursts, until effective reconditioning is attained. Upon effective reconditioning of the battery, the test cycle is stopped, even during midburst of a current pulse.

The response to the reconditioning cycles will be an initially high but decaying voltage. Effective reconditioning is achieved when the response voltage drops below a predetermined level, here 2.1 V, and decreases at a rate no greater than 15 mV in 10 seconds. If these conditions are met, then reconditioning has been achieved and the diagnostic proceeds with Level II SOC testing, S222, since the battery will be in the high battery voltage state for the charged battery. If over the course of the reconditioning cycles, the voltage does not respond as described (e.g., only a rising voltage), the battery is determined to be defective and must be removed from service. That is, if the voltage increases during the current pulse bursts, the battery is defective, probably due to a low electrolyte.

Stage III

Under all conditions, if IR<$IR_{MAX}$, the diagnostic proceeds into Stage III, which has two levels of testing.

Level I Testing—Low State (1.6 V) Open Circuit Voltage

For a battery in the low voltage state whose IR<$IR_{MAX}$, as determined in S208, the SOC is measured in a Level I test in S216. During this test stage in S216, a linearly increasing charge current is applied to the battery, and the battery response voltage is measured. The current begins at 0 Amps and increases linearly until either the battery voltage reaches a predetermined voltage, for example 2.05 V for one cell of the battery, or the ramp current reaches its specified limit. Batteries rated at 30 Ah and 40 Ah cell capacity are limited to 50 A, while 8 Ah and 12 Ah batteries are limited to 25 A. The rate at which the current is increased (ramp slope) illustratively is 0.6 Amps/ sec. The current increase does not have to be linear, as long as it increases monotonously. Once either the voltage or current limit is reached, the current is then decreased with the same but negative slope, until it reaches 0 Amps.

Battery voltage is continually measured and recorded throughout the test by the system of FIG. 1. In S217 the slope, or first derivative, of the measured voltage response curve (dV/dt) is calculated, as is the second derivative of the voltage response $$\left(\frac{d^2 V}{dt^2}\right).$$

When the $$\frac{d^2 V}{dt^2}$$

value reaches its maximum, this indicates the onset of the chemical reactions associated with a high voltage state (1.86 V OCV) of the charge cycle. The current at which this occurs is designated as the transition current ($I_{TRAN}$).

Figure 4:
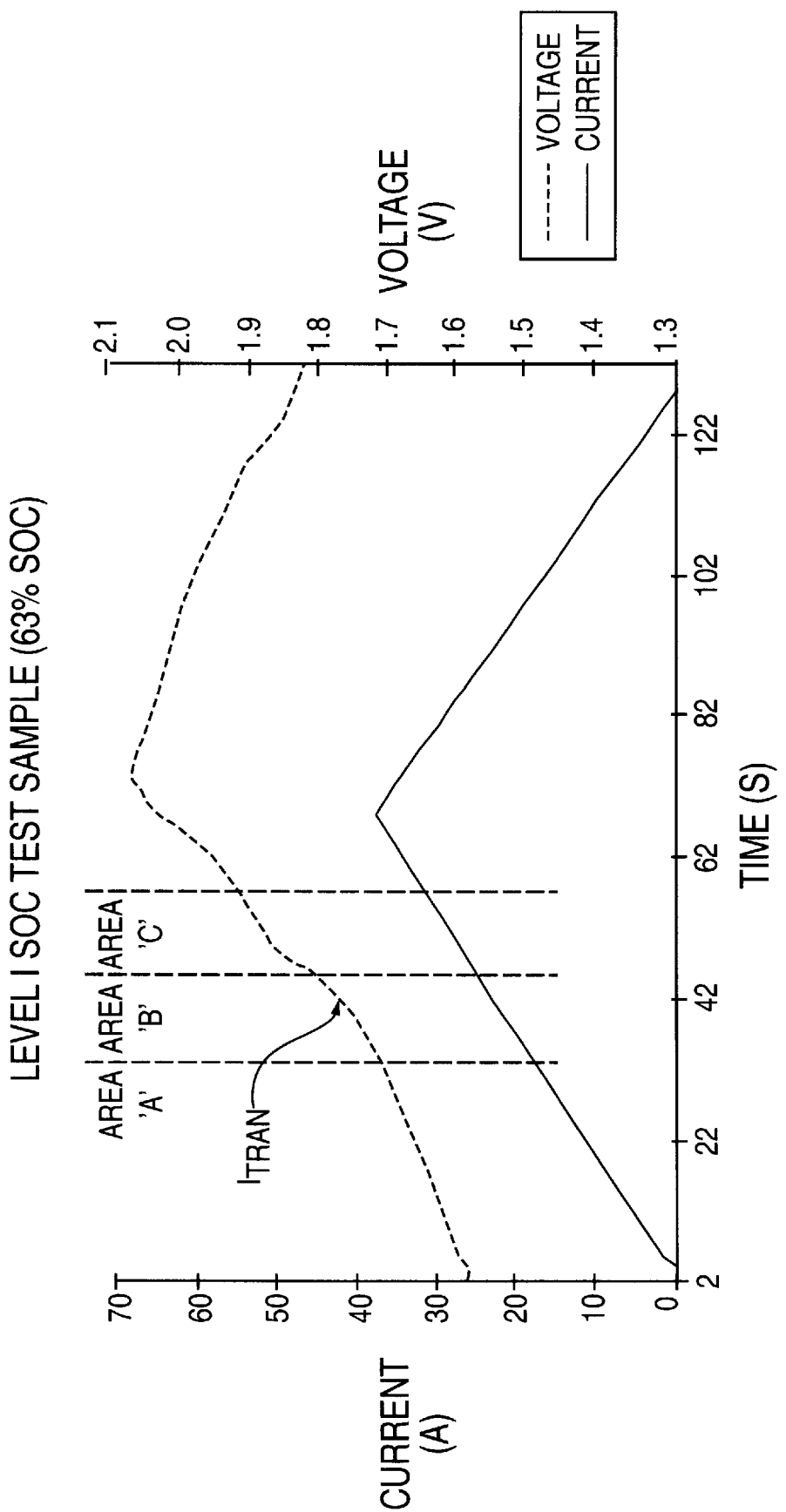
FIG. 4 is a graph showing a typical response of a battery in the first (low) voltage state to a current ramp test during determination of its state of charge.

FIG. 4 illustrates a typical Level I SOC current ramp test cycle, as applied to a 40 Ah single cell battery at 63% SOC and the battery voltage response. The voltage dV/dt response, i.e., the slope, is initially linear, with a substantially constant slope (Area A). The voltage then begins a faster rise with a continually increasing slope (Area B), followed by a period where the slope decreases (Area C). The transition current ($I_{TRAN}$) is the current at which the slope of the voltage response increases most rapidly, as indicated. $I_{TRAN}$ determinations are made by directly analyzing the $$\frac{d^2 V}{dt^2}$$

computations. An averaging technique, such as seven point averaging, can be used.

It has been found that the $I_{TRAN}$ can be correlated directly with the state of charge of the battery. SOC determinations based on this method can find the SOC from anywhere from 40% to 100% SOC. A battery with a low voltage stage, 1.6 V OCV, will typically be found only up to 85% SOC. The 70–85% SOC occurs when a battery is reversed from a discharge stimulus, before the battery voltage state transitions to 1.86 V. If a battery SOC is below 40% SOC, it has been found that no peak and hence no $I_{TRAN}$ will appear on the voltage response, and that SOC can be specified only as <40% SOC. Since a battery in such a low state of charge is not usable in any case without charging, this will be sufficiently informative.

Figure 5:
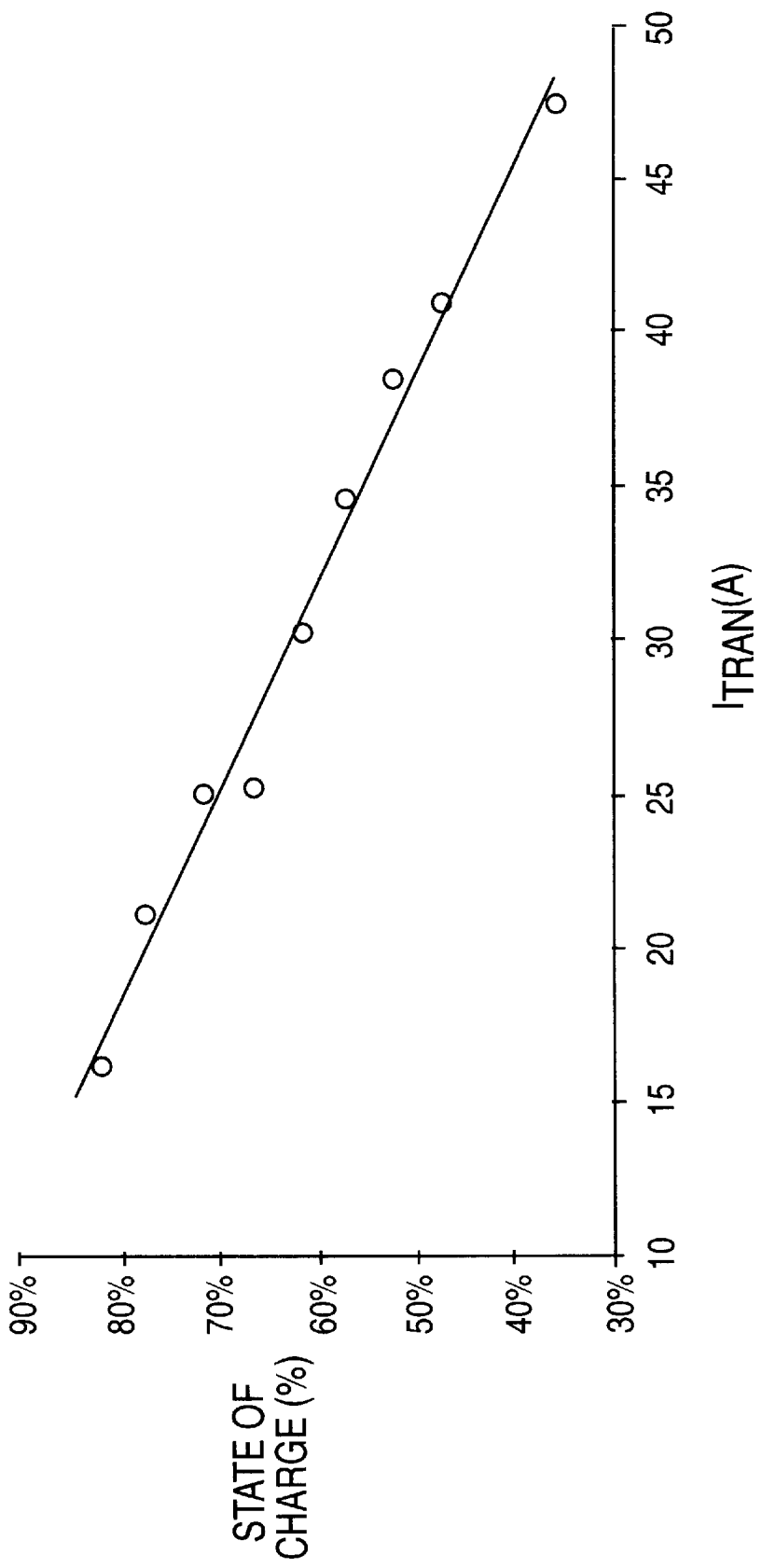
FIG. 5 is a sample calibration graph of the state of charge of a battery in the first voltage state versus current transition values.

FIG. 5 shows one such calibration curve developed for a 40 Ah nominally rated silver-zinc battery of one cell, at the low voltage state, 1.6 V OCV. The curve of FIG. 5 was developed by uniformly charging/discharging 40 Ah cells, and by applying the ramp test to batteries at various identified states of charge. Plotted are the $I_{TRAN}$ values at each test point versus the corresponding battery SOC. Similar curves have been developed for 8 Ah, 12 Ah, and 30 Ah nominally rated cells and can be represented in algorithm form. The resulting calibration curves and analysis algorithms are presented in Table 2. Once the algorithms are developed, any battery of those sizes can be tested to find its $I_{TRAN}$ and its SOC determined from the appropriate algorithm. That is, for a battery whose OCV is 1.6 V and IR<$IR_{MAX}$, the ramp test of S216 is applied, $I_{TRAN}$ is measured in S217 and the algorithm of Table 2 are used in S218 to determine SOC.

TABLE 2

Level I Algorithms

| Cell Size (Capacity) | Level I SOC (%) Algorithm |
| --- | --- |
| 8 Ah | = −.0374* $I_{TRAN}$ + .7762 |
| 12 Ah | = −.0281* $I_{TRAN}$ + .7397 |
| 30 Ah | = −.0046* $I_{TRAN}$ + .7934 |
| 40 Ah | = −.0137* $I_{TRAN}$ + 1.0302 |

Level II Testing—High State (1.86 V) Open Circuit Voltage

This applies both to batteries that have originally been found to have high state OCV in S206 and whose IR<$IR_{MAX}$, as determined in S212, or whose IR>$IR_{MAX}$ and have been reconditioned in S214 to achieve a desired IR.

A battery originally having a high state OCV and an IR<$IR_{MAX}$, is tested in S220 with the current ramp in a manner similar to S216. A battery of a high voltage state originally having IR>$IR_{MAX}$ but has been reconditioned in S214 is tested with a current ramp in S222. In each of S220 and S222, a linearly increasing charge current is applied to the battery, and the battery response voltage is measured. The current begins at 0 Amps and increases linearly until either the ramp current reaches a predetermined level, here illustratively 18 A, or until the voltage limit is reached. If the battery has undergone reconditioning, the voltage limit is 2.15 V/cell of the battery in S222. Otherwise, the voltage limit is 2.1 V/cell in S220. The rate at which the current is increased in both S220 and S222 is, in the example, 0.1 A/sec. The current increase does not have to be linear, as long as it increases monotonously.

Once reaching the current or voltage limit in S220 and S222, the current is then decreased with the same but negative slope until it reaches 0 Amps. Battery voltage is continually measured and recorded throughout the test by the system of FIG. 1. The slope of the voltage curve (dV/dt) in each of S220 and S222 is continually calculated and analyzed in S224. When the dV/dt slope goes through a minimum, it indicates the transition from charge reaction to gas reaction. The current at which this occurs is designated the transition current ($I_{TRAN}$).

Figure 6:
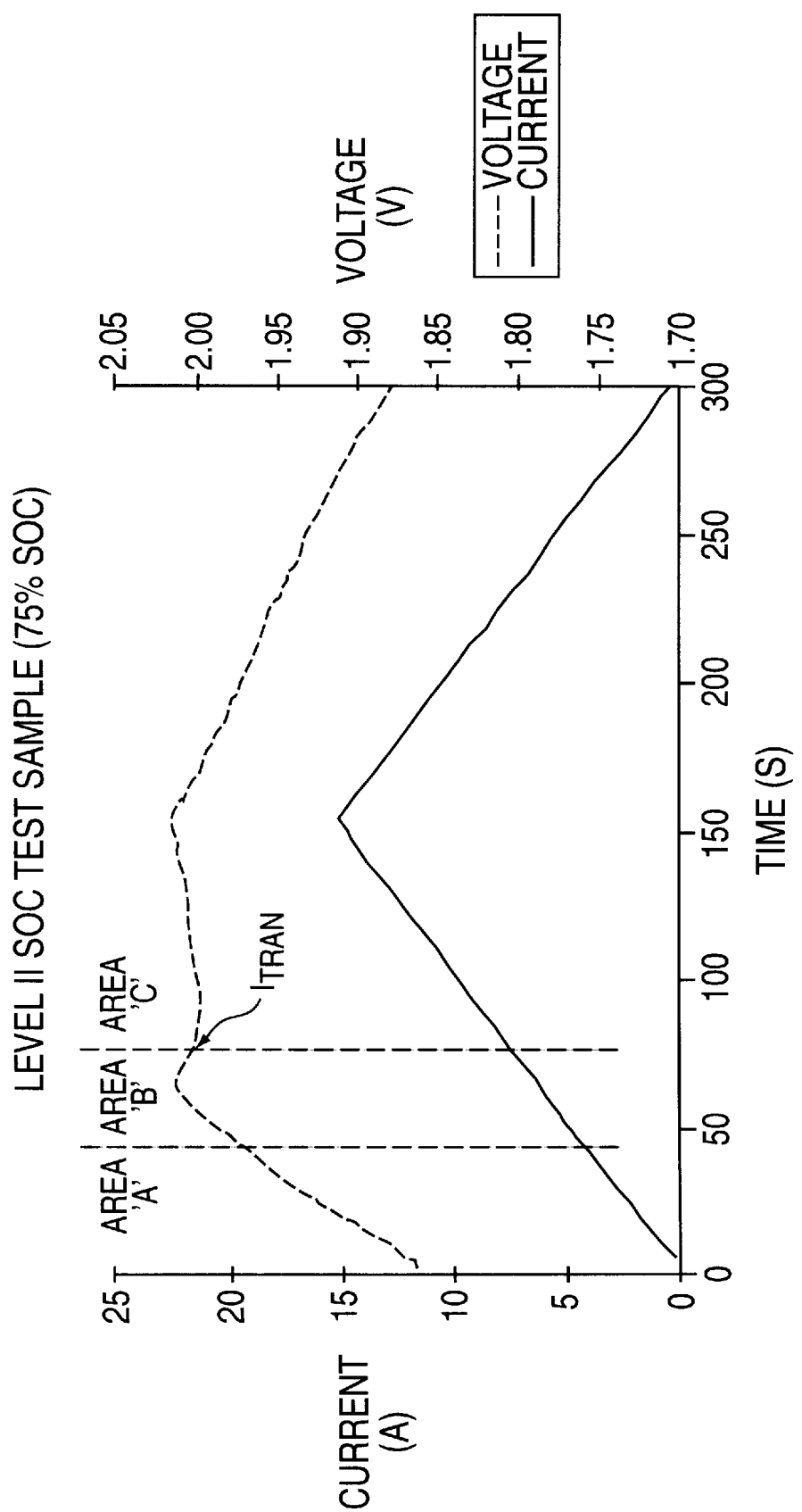
FIG. 6 is a graph showing a typical response of a battery in the second (high) voltage state to a current ramp test during determination of its state of charge.

FIG. 6 illustrates a typical Level II SOC test, as applied to a 40 Ah single cell battery at 75% SOC, and the battery voltage response. The voltage response curve initially increases linearly with a constant slope (Area A). The voltage slope then begins decreasing, causing a downward curving portion in the voltage response curve (Area B). For a regular ramp test S220 (no reconditioning applied earlier), this slope may become negative and form a "hump", as can be seen in FIG. 6. For a ramp test as applied to a S222 reconditioned cell, the voltage slope will not go negative, but will still decrease distinctly as would be evident on analysis. The voltage response slope begins increasing once again until it reaches and maintains a final constant slope (Area C). The transient current $I_{TRAN}$ is the current at which the voltage slope reaches its minimum (Area B) as indicated. The $I_{TRAN}$ determinations are made from directly analyzing the dV/dt calculation computations. A seven point averaging technique can be used.

It has been found that the transient current $I_{TRAN}$ can be directly correlated with the battery SOC. State of charge of a battery having a high state OCV tested in S220 or S222 can be accurately determined in the range from 50% to 100% SOC. For a battery having a high state OCV but an SOC in the range of 35% to 50%, no minimum slope will be detected. The SOC for a Level II battery voltage state can therefore accurately be determined to be within the above 50% to 100% SOC range.

Measurement algorithms, or curves, have been developed relating $I_{TRAN}$ to battery SOC independently by battery size, specific to capacity. Data corresponding to the algorithms is stored as part of the computer program and is activated for a battery undergoing diagnosis in accordance with the identification of the battery in S102.

Figure 7:
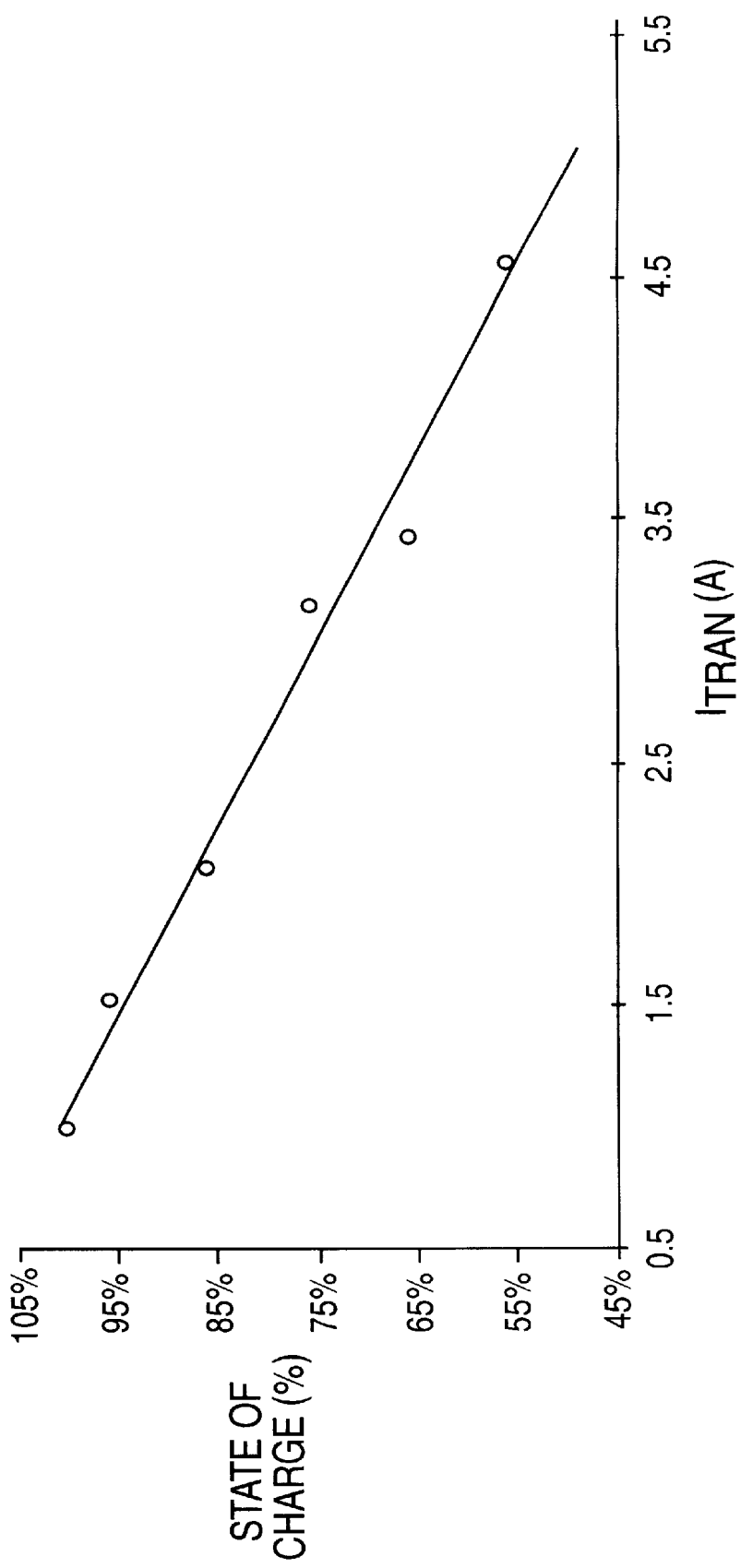
FIG. 7 is a sample calibration graph of the state of charge of a battery in the second voltage state versus current transition values.

FIG. 7 shows an SOC calibration curve for a 40 Ah nominally rated silver-zinc battery with a high state (1.86 V) open circuit voltage. It was developed by uniformly charging and discharging 12 Ah single cells, and by applying the ramp test at various identified states of charge. Plotted are the $I_{TRAN}$ values at each test point versus the corresponding battery SOC. Similar work was done with 8 Ah, 30 Ah, and 40 Ah nominally rated cells. The resulting calibration curves and analysis algorithms are shown in Table 3.

TABLE 3

Level II Algorithms

| Cell Size (Capacity) | Level II SOC (%) Algorithm |
|---|---|
| 8 Ah | = −.4838* $I_{TRAN}$ + 1.6195 |
| 12 Ah | = −.1396* $I_{TRAN}$ + 1.1455 |
| 30 Ah | = −.0736* $I_{TRAN}$ + 1.1862 |
| 40 Ah | = .0417* $I_{TRAN}$ + 1.1612 |

The algorithms are used in S226 to determine the SOC of a battery in the same manner discussed above relative to the Level I algorithms of Table 2.

In each of the Level I and Level II tests, determination of the slope of the voltage curve (dV/dt) was accomplished by calculating the difference in successive voltage values over a small interval. This data preferably is then subjected to an averaging technique, such as using seven points, which is found to sufficiently eliminate noise caused by the electronic circuitry. For a developmental system, using fewer points for averaging resulted in insufficient noise suppression, while including more points risked peak smoothing. The number of points to be used for smoothing will depend on the experimental set up, instrumentation and procedure. Similarly, the second derivative of the voltage $$\left(\frac{d^2V}{dt^2}\right)$$

is computed by calculating the difference in successive voltage slope (dV/dt) values over a small interval. This data is also subjected to averaging, such as at seven points, in order to eliminate noise.

To use one of the algorithms of Tables 2 and 3, once the appropriate $I_{TRAN}$ value of a battery has been measured, it is applied to the appropriate algorithm for the type of battery as listed in Table 2 and Table 3. In summary, the specific SOC measurement algorithm which is to be used is dependent on both open circuit voltage (OCV) and battery size (capacity). The SOC is calculated as a function of $I_{TRAN}$ using the appropriate algorithm. All calibrations described were made at room temperature, but they can be adapted for different temperatures.

The following is an example of an SOC measurement in accordance with the invention.

Example #1

Battery "M", a 40 Ah nominally rated single silver-zinc cell was discharged at 10 A until the cell reached 0% state of charge (1.1 V) upon discharge. This was done to be certain of the eventual state of charge. The battery was then charged at 2 A (manufacturer recommended charge rate) until a 28.8 Ah charge had been put into the cell. The battery was then subjected to the state of charge measurement test procedure of FIG. 3. The open circuit voltage was measured to be 1.86 V, and the IR was measured to be 6.5 mΩ. The diagnostic system program proceeded to Level II type SOC testing and then proceeded to apply a 0.1 A/sec current ramp to the cell. The minimum dV/dt was determined as described above. The $I_{TRAN}$ was detected to be at 9.98 Amps. This value was then used with the developed 40 Ah algorithm in Table 3 for a high state (1.86 V) open circuit voltage, giving a state of charge measurement equal to 74.5% SOC. To confirm the result, the cell was then charged at 2 A until 100% SOC (2.03 V), and then subjected to a complete discharge at 10 A, to determine full capacity. The battery gave out 39.2 Ah. Therefore, the actual state of charge was determined as 28.8 Ah/39.2 Ah, which equals 73.5% SOC. This method can be used since silver-zinc charge efficiency is typically 100%. This means that the Ah in will typically equal the Ah out. The invention thus produced a state of charge measurement result that was accurate to within one percent offset error, thereby validating the use of the algorithm.

Internal resistance measurements could be made with other IR measurement tools (e.g., an HP Multimeter Model 43383). However, the values used as maximum IR limits may need to be redesignated in response to the different measurement tool. Also, the use of different values for pulse amplitude and/or duration can be used. However, appropriate IR limits would have to be redesignated based on the test specification.

It is possible for the ramp test to be performed using different test parameters (e.g. ramp slope) and limits. Re-calibration of the measurement algorithms would be required to match the actual test specifications as $I_{TRAN}$ measurement results are not linearly related to any of the above mentioned test parameters. The use of a single ramp slope for all testing was initiated with the intent of keeping a single set of parameters for all battery testing. This may be of use in developing a normalized procedure for a wide range of cell capacities. However, using different slopes for different sized batteries may provide for more accurate and recognizable result measurements at each individual cell level.

The high IR reconditioning technique described in S214 can also be performed with alternative pulse amplitudes and widths. The exemplary procedure described herein were developed in conjunction with the ramp test that followed, and optimized in that respect. However, the application of current pulses with appropriate rest time will serve to recondition the battery to some degree, regardless of pulse intensity and duration details. Variation from the specifications listed in this invention should be minimal if efficient state of charge test results are to be expected following reconditioning.

3. Determination of Battery Capacity

The method currently used to determine the capacity of a silver-zinc battery is to charge the battery to 100% state of charge, and then fully discharge the battery at constant current. The capacity, in Amp hrs, is determined by multiplying the discharge current (Amperes) by the discharge time (hours). Following this, the battery must be fully charged once again to be ready for use. This method involves a significant amount of charging and discharging. This is extremely time consuming and destructive to overall battery life. The life factor is directly related to the limited cycle life of silver-zinc batteries. That is, the battery can withstand only a certain number of charge/discharge cycles. Similar problems exist with respect to other types of batteries. It is preferred that battery capacity be determined without requiring that the battery be discharged. This makes the time of determination faster and does not have any harmful effect on the battery and its performance.

Figure 8:
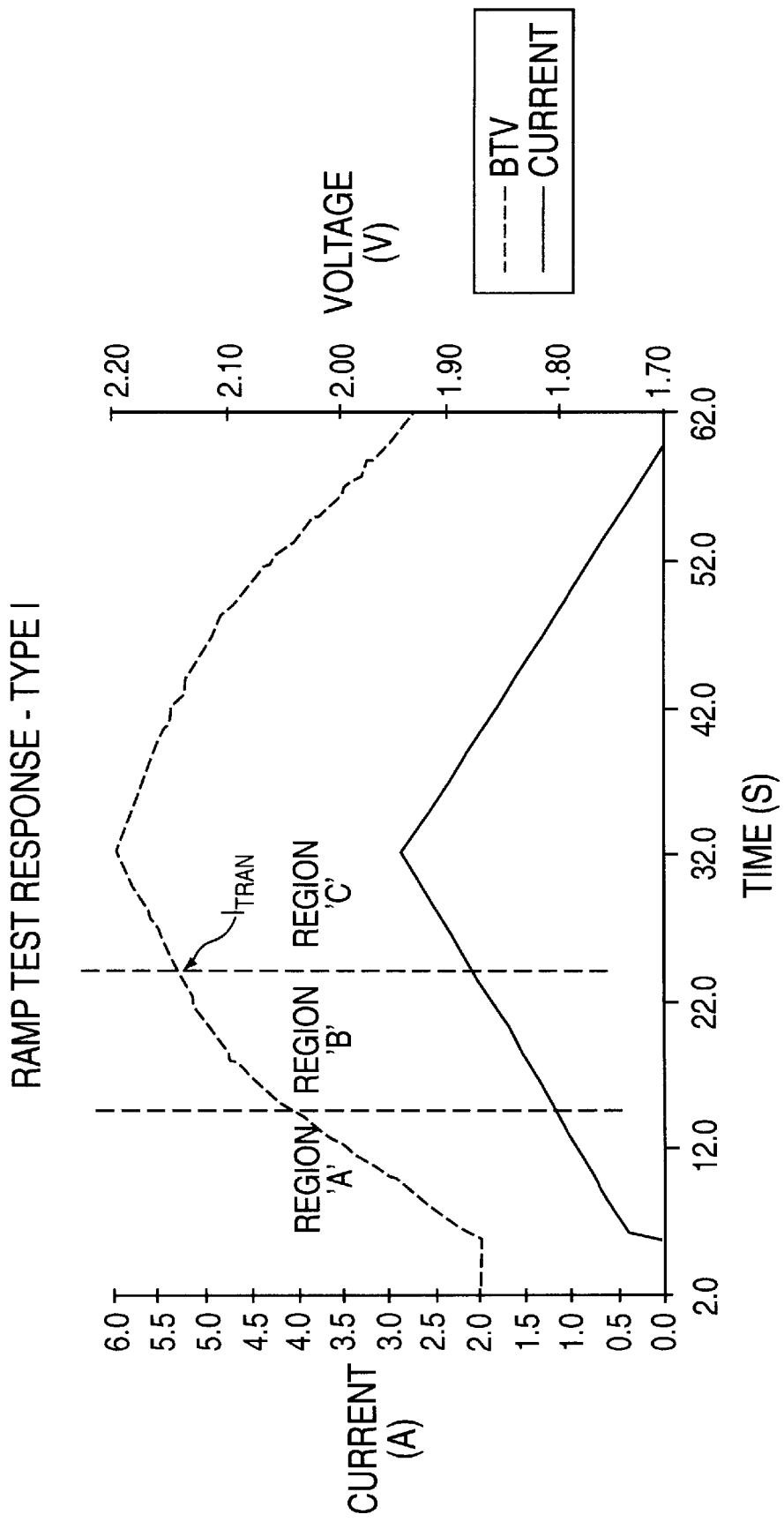
FIGS. 8 and 9 are graphs showing the two possible response curves of a fully charged silver-zinc battery to a current ramp test.
Figure 9:
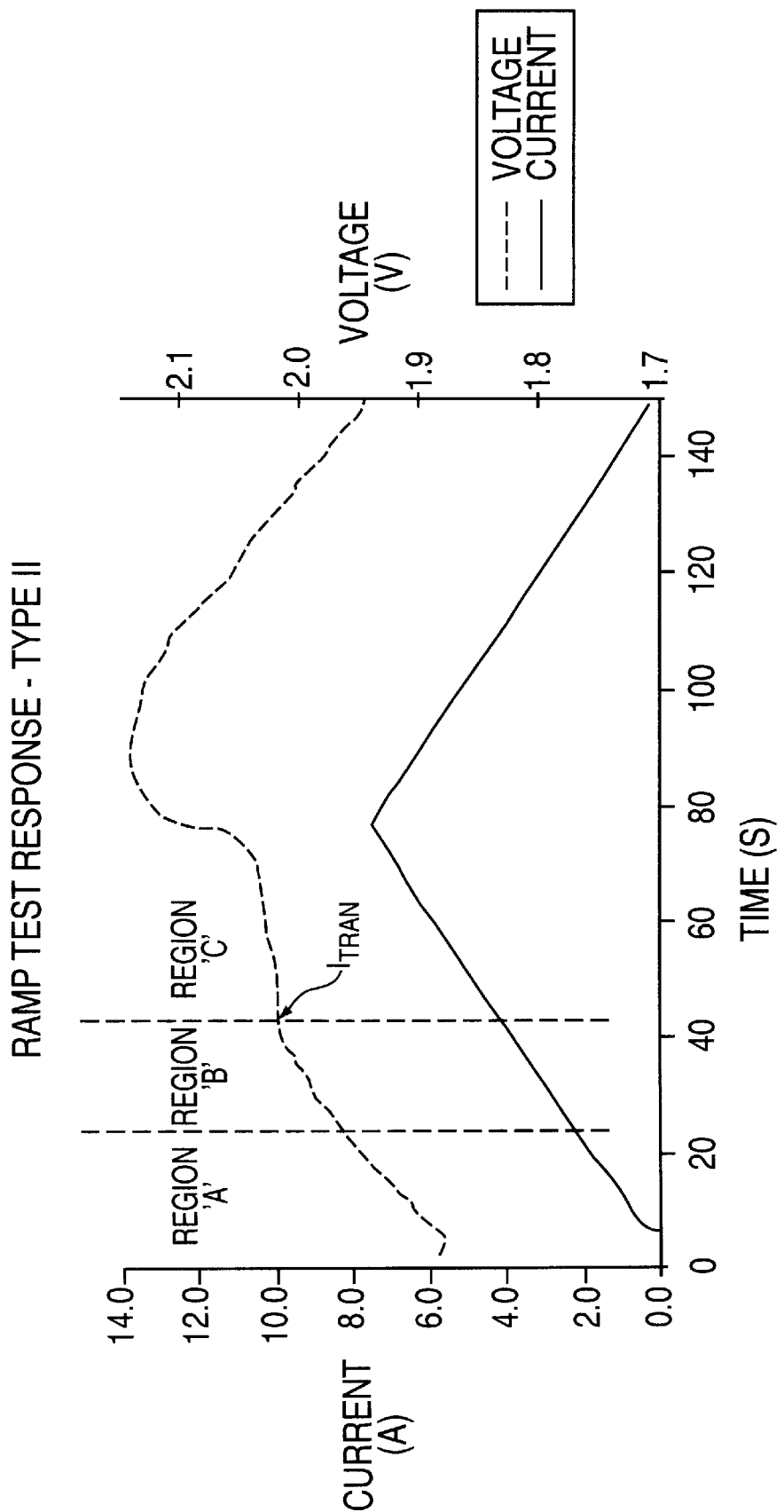
Figure 10:
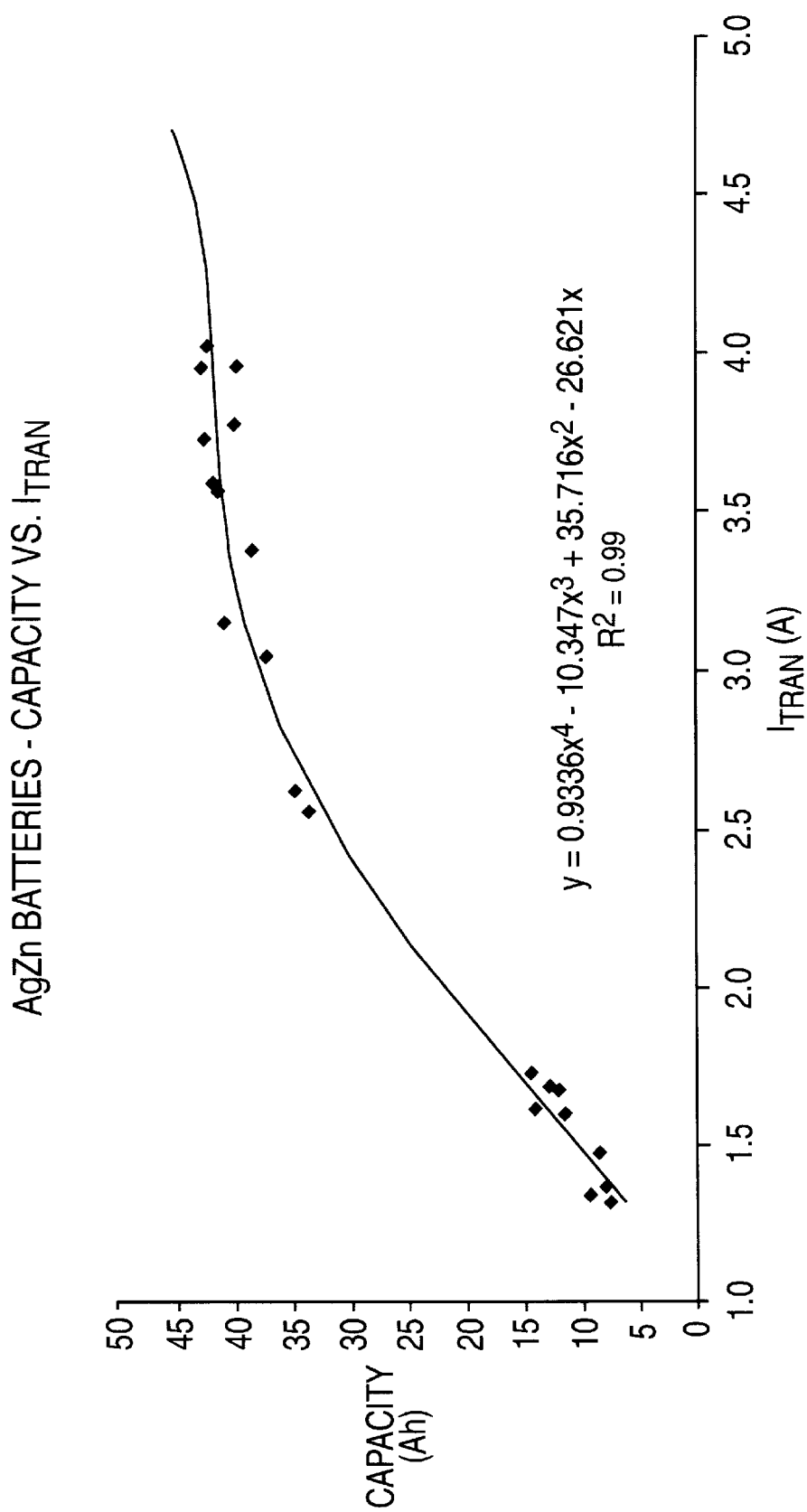
FIG. 10 is a calibration graph of the relationship of capacity of an Ag—Zn battery and transition current.

In the preferred embodiment of the invention, as described relative to steps S144, S146, S148, S150 and S152 of FIG. 2 and explained in further detail in FIGS. 8–10, the capacity of a fully charged silver-zinc battery is determined without discharging the battery. In performing these steps, the cell is left connected to the system of FIG. 1.

The computer application program operates to charge the battery to full capacity (100% state of charge). Many methods can be used to fully charge a silver-zinc battery, with the method used in the preferred embodiment accomplished, as represented in S144 of FIG. 2, using a constant current charge as per the cell manufacturer's specifications. This charge rate is typically a C/20 Amp rate, where "C" represents the capacity of the particular battery tested. For example, a battery rated at 40 Ah would be charged at 2 A. The charge is halted once the battery reaches 2.03 V for a single cell battery or 2.00 V for a multi-cell battery. After charging, the battery is allowed to rest for 10 minutes and until the battery temperature drops below 25° Centigrade, as measured by the thermocouple 12. The computer program has the period of ten minutes, or other suitable time, as part of the charge cycle program. At this point, the battery is subjected to a test cycle.

Before starting the test cycle, safe voltage and current limits are established by knowing the battery characteristics. These also are set into the computer program. The test cycle is comprised of two separate stages. The first stage involves determining test limits for the second stage, while the second stage involves the actual testing and capacity determination.

During the first test stage, called Stage 1 and represented in S146, a step charge current (pulse) is applied to the battery, and the battery response voltage is measured. Again, the analysis system of FIG. 1 can be used. The current is started from 0 Amps and increases instantaneously (as fast as the power supply is capable) to a proportion of the rated amperage capacity C of the cell, for example, 'C/5' Amps. The current is maintained at that amplitude for 10 seconds, after which it returns instantaneously to 0 Amps. The voltage and current are continuously measured and recorded during this test cycle. The final voltage measured before the step falls back to 0 Amps is designated as the voltage limit to be used for Stage 2 testing.

During the second stage of the test, a linearly increasing charge current is applied to the battery (S148), and the battery response voltage is measured. The current begins at 0 Amps and increases linearly until either the ramp current reaches a predetermined value, for example 15 Amps, or the battery voltage reaches the limit voltage established in stage 1. The rate at which the current is increased illustratively is 0.1 Amp/sec. The current increase does not have to be linear, as long as it is monotonously increasing. Once reaching either the preset current or voltage limit, the current is then decreased with the same but negative slope until it reaches 0 Amps. Battery voltage is continually measured and recorded throughout the test. The slope of the voltage $$\left(\frac{dV}{dt}\right)$$

is calculated, as is the second derivative of the voltage response $$\left(\frac{d^2V}{dt^2}\right).$$

A fully charged silver-zinc battery subjected to the above ramp test will respond in one of two possible ways. FIG. 8 shows a first (Type I) such typical response. This figure is taken from the ramp test results of a 12 Ah silver-zinc single cell at 100% state of charge. The bottom curve is the current ramp that is applied to the battery, and the top curve is the voltage response. Considering only the data corresponding to the rising portion of the applied current ramp, the voltage response curve has three regions. Region A and Region C are relatively linear curves with different constant slopes. Region B is a non-linear curve section which serves as a transition area between the two more linear portions. When the voltage reaches the beginning of region C, it indicates the transition from the battery charge reaction to gas reaction. The current at which this transition occurs is designated as the transition current ($I_{TRAN}$). This is the output of S148 of FIG. 2.

FIG. 9 shows a second (Type II) possible response of a silver-zinc battery to the above described current ramp test. The figure is taken from the ramp test results of a 40 Ah silver-zinc single cell at 100% state of charge. Regions A and B in FIG. 9 are substantially identical in form to the corresponding regions described in FIG. 8, while region C is somewhat different. Instead of a constant slope response in region C, the voltage response is more of an exponential type rise, though in this case preceded by a portion of either constant or linearly increasing voltage. The constant voltage portion results from the larger size of the battery relative to the current ramp rate. This causes the ramp test response to be stretched in time, thereby better accentuating the battery reactions at each instant. The region C response of smaller capacity batteries will, beginning at region C, contain much smaller areas of constant or linearly increasing voltage, if any at all, reflecting the identical gassing reaction of these batteries. Nonetheless, the beginning of Region C and end of region B is still the mark of the beginning of the battery gas reaction. Therefore, it is designated as the transition current ($I_{TRAN}$).

In both cases of FIGS. 8 and 9, $I_{TRAN}$ is measured as the point where the voltage slope $$\left(\frac{dV}{dt}\right)$$

stops decreasing, and either begins to remain constant, for Type II $$\left(\frac{d^2V}{dt^2}=0\right)$$

or for Type I begins increasing $$\left(\frac{d^2V}{dt^2} > 0\right).$$

This point is marked appropriately on both figures.

It has been found that the transition current ($I_{TRAN}$) as measured above, can be directly correlated with battery capacity and this is done in S150. Batteries with higher capacities C will exhibit higher $I_{TRAN}$ values in response to the identical current ramp test with respect to the same current slope and the same current limit. The voltage limit is always determined by a current pulse test on an individual test basis for a given battery.

FIG. 10 shows a calibration curve, or algorithm which may be stored in a computer, which defines the relation between battery capacity and transition current ($I_{TRAN}$). Also shown in FIG. 10 are various test points used to define the calibration curve. These data points were developed from testing several single cell batteries of various sizes, by fully charging the batteries and applying the above described test. The application of the curve of FIG. 10 to a battery under test is described below.

The slope of the battery's voltage response curve $$\left(\frac{dV}{dt}\right),$$

such as shown in FIGS. 8 and 9, is determined by calculating the difference in successive voltage values over a small time interval. This data is then subjected to an averaging technique, such as a seven point averaging technique, i.e., the slope is measured over seven segments and the results averaged. This number of segments averaged, which can be varied, has been found to sufficiently eliminate noise caused by the electronic circuitry and measurement variability. Using fewer points for averaging may result in insufficient noise suppression, while including more points may suppress the sharpness of the $$\frac{dV}{dt}$$

data.

The second derivative $$\left(\frac{d^2V}{dt^2}\right)$$

of the voltage response is calculated and is used in the final determination methodology. The $$\frac{d^2V}{dt^2}$$

values are determined by calculating the difference in successive voltage slope $$\left(\frac{d^2V}{dt^2}\right)$$

values over a small interval. This data is also subjected to an averaging, such as over seven points, to eliminate noise, as described above.

$I_{TRAN}$ for the battery is calculated by first locating a region, such as that designated B in FIG. 8, in the voltage response curve that is identifiable by a constant decrease in voltage sloped $$\left(\frac{dV}{dt}\right).$$

At this point, the $$\frac{d^2V}{dt^2}$$

value will be somewhat below 0. The $$\frac{d^2V}{dt^2}$$

is then measured forward. When $$\frac{d^2V}{dt^2} > 0$$

for 10 samples or more (approximately 2 sec.), the initial point in that series is determined to be $I_{TRAN}$. The battery capacity is then calculated as a function of the $I_{TRAN}$ by using the curve shown in FIG. 10 or its algorithm. This can be done manually or done automatically by the computer A of FIG. 1.

All calibrations in this invention were made for room temperature and can be adjusted for different temperatures.

It is possible for the current ramp test S148 to be performed using different test parameters (e.g. ramp slope). However, it is important to note that a different calibration curve specific to that slope must be generated and used for testing. Parameters can only be changed to a certain degree. In addition, due to the non-linearity of the ramp test response, changes in parameters will not have a proportional effect on changes in the test response and calibration curve results. Therefore, new calibration curves and their algorithms must be developed special to the test conditions used.

The capacity calibration curve of FIG. 10 has been developed to function across a wide range of capacity (6 Ah–50 Ah), using a single test specification for the entire range. This resulted in a nonlinear calibration curve, that can be defined by a multi-order polynomial. Note the lower sloped area in the 40 Ah to 50 Ah range, as opposed to the steeper 10 Ah to 30 Ah range. Curve resolution can be improved by adapting the current ramp test specifications to the specific battery capacity range. For example, an algorithm can be developed to test 40 Ah cells by optimizing ramp parameters to the 40 Ah cell. However, effective capacity range would be limited to 30 Ah–50 Ah. This would be ideal for a specific test specimen, though not ideal for a setup that is to provide results over a wide range of battery capacities.

Once the calibration curve is developed, any battery within the said range (6 AH–50 AH) of nominal capacity can be charged to 100% SOC and have the above capacity determination applied. An appropriate $I_{TRAN}$ value is measured and through application to the capacity algorithm, a capacity determination is made.

Specific features of the invention are shown in one or more of the drawings for convenience only, as each feature may be combined with other features in accordance with the invention. Alternative embodiments will be recognized by those skilled in the art and are intended to be included within the scope of the claims.

We claim:

1. A method for diagnosing a battery having high and low open circuit voltage states corresponding to state of charge conditions of the battery, comprising:

measuring the internal resistance (IR) of the battery;

measuring the battery open circuit voltage (OCV);

comparing the battery's measured internal resistance to a predetermined maximum internal resistance ($IR_{MAX}$) for the battery; and subjecting a battery having an internal resistance less than said predetermined maximum internal resistance to a type of state of charge (SOC) test depending on the existence of the high or low voltage state of the battery as determined by the measuring of the battery open circuit voltage.

2. The method of claim 1 further comprising:

determining a battery defect in the form of a low electrolyte level by the measurement of the open circuit voltage indicating the low voltage state and an internal resistance greater than said maximum internal resistance for the battery.

3. The method of claim 1 further comprising:

determining the need for reconditioning of a battery by the measurement of an open circuit voltage of the high state and an internal resistance greater than said maximum internal resistance for the battery.

4. The method of claim 1 wherein the step of measuring the battery internal resistance comprises:

applying to the battery a pulse of current of value A amperes having a leading edge and a trailing edge;

measuring the voltage change (dV) produced on the trailing edge of the applied current pulse (dl) to determine dV/dl; and computing the battery internal resistance from dV/dl.

5. The method of claim 1 wherein the step of measuring the battery internal resistance comprises:

applying to the battery a pulse of current of value I having a leading edge and a trailing edge;

measuring the voltage of the battery at the time of the maximum value of the trailing edge of the current pulse ($V_{FALL}$) and the open circuit voltage after termination of the current pulse ($OCV_{AFT}$); and computing the internal resistance (IR) as IR=($V_{FALL}$−$OCV_{AFT}$)/I.

6. The method of claim 1 wherein the step of subjecting a battery having an internal resistance less than maximum internal resistance and an open circuit voltage of one of the low state or the high state to a state of charge test comprises:

applying a current ramp having a positive rising portion and a negative falling portion over a period of time (t) to the battery and measuring the battery voltage response (V);

computing from the measured voltage response a current value $I_{TRAN}$ corresponding to an onset of a gassing reaction in the battery; and determining the value of state of charge as a function of $I_{TRAN}$.

7. The method of claim 6 wherein $I_{TRAN}$ is computed on the positive rising portion of the measured voltage response as a maximum $$\frac{d^2 V}{dt^2}.$$

8. The method of claim 7 wherein for a battery of a low voltage state $I_{TRAN}$ is computed as the maximum positive value of $$\frac{d^2 V}{dt^2}.$$

9. The method of claim 7 wherein for a battery of a high voltage state $I_{TRAN}$ is computed as the maximum negative value of $$\frac{d^2 V}{dt^2}.$$

10. The method of claim 1 further comprising:

selecting a battery in which the state of charge exceeds a predetermined value; and determining the Amp.hour capacity of the battery.

11. The method of claim 10 wherein the step of determining the capacity of a battery comprises:

charging the battery at a constant current to a predetermined charge state;

applying a ramp current of positively increasing slope to the battery;

measuring the battery voltage (V) response to the applied ramp current;

computing $I_{TRAN}$ as the point on the voltage response curve where on the positive position of the current ramp the slope of the voltage dV/dt either remains constant or begins increasing after a period of decreasing $$\left(\frac{d^2 V}{dt^2} \geq 0 \text{ after a period of } dV/dt < 0\right);$$

after a period of dV/dt<0); and determining the battery capacity as a function of $I_{TRAN}$.

12. The method of claim 11 further comprising stopping the ramp current when either the applied ramp current has reached a predetermined value or the voltage response thereto reaches a predetermined limit.

13. The method of claim 11 wherein the step of determining the battery capacity as a function of $I_{TRAN}$ comprises:

preparing one of a curve equation and algorithm corresponding to the $I_{TRAN}$ versus capacities of batteries having different measured values of $I_{TRAN}$; and determining the capacity of the battery under test from the curve equation or algorithm.

14. A method of determining the Amp.Hour capacity of a battery comprising:

charging the battery at a constant current to a predetermined charged state;

applying a pulse of current to the battery and monitoring the battery response voltage to determine a V limit at the time before the current pulse returns to a minimum value;

applying a ramp current of positively increasing slope to the battery and monitoring the battery response voltage V;

terminating the ramp current at one of a predetermined current limit or the response voltage reaching V limit;

computing $I_{TRAN}$ corresponding to an onset of battery gassing reaction as the point on the voltage response curve where on the positive portion of the current ramp the slope of the voltage V response curve either remains substantially constant or begins increasing after a period of decrease; and determining the battery capacity as a function of $I_{TRAN}$.

15. The method of claim 14 wherein the step of determining the battery capacity as a function of $I_{TRAN}$ comprises:

preparing one of a curve equation and algorithm corresponding to the $I_{TRAN}$ versus capacities of batteries having different measured values of $I_{TRAN}$; and determining the capacity from the curve or algorithm.

16. The method of claim 1 further comprising the step of reconditioning a battery having a high state open circuit voltage state and an internal resistance greater than said predetermined maximum internal resistance before subjecting the battery to the state of charge test.

17. The method of claim 16 wherein said step of reconditioning comprises applying successive pulses of current to the battery to lower its internal resistance.

18. The method of claim 6 further comprising determining the Amp.hour capacity of the battery by charging the battery at a constant current to a predetermined charge state;

applying a ramp current of positively increasing slope to the battery;

measuring the battery voltage (V) response to the applied ramp current;

computing $I_{TRAN}$ as the point on the voltage response curve where on the positive position of the current ramp, the slope of the voltage dV/dt either remains constant or begins increasing after a period of decreasing $$\left(\frac{d^2V}{dt^2} \geq 0 \text{ after a period of } dV/dt < 0\right);$$

after a period of dV/dt<0); and determining the battery capacity as a function of $I_{TRAN}$ by preparing one of a curve equation and algorithm corresponding to the $I_{TRAN}$ versus capacities of batteries having different measured values of $I_{TRAN}$ and determining the capacity from the curve equation or algorithm.

19. A system for diagnosing a battery having high and low open circuit voltage states corresponding to state of charge conditions of the battery comprising:

computer means including a control program for (a) controlling the application of a ramp current from a current supply source to a battery and measuring the voltage response, (b) determining the point of current transition due to battery chemical reaction in response to the applied ramp current, and (c) computing the battery state of charge from one of at least one algorithm of transition current point versus state of charge and the Amp.hour battery capacity from at least one algorithm of transition current versus Amp.hour battery capacity.

20. The system of claim 19 wherein said computer means further comprising:

means for measuring the battery open circuit voltage (OCV);

means for measuring the internal resistance (IR) of the battery; and wherein said computer means determines the point of current transition in a manner based upon the measured open circuit voltage which determines its voltage state and its measured internal resistance.

* * * * *